United States Patent [19]

Yonezawa et al.

[11] 4,146,413
[45] Mar. 27, 1979

[54] METHOD OF PRODUCING A P-N JUNCTION UTILIZING POLYCRYSTALLINE SILICON

[75] Inventors: Toshio Yonezawa, Yokosuka; Toshio Mitsuno, Oita; Kiyoshi Takaoki, Yokohama; Takashi Ajima, Tokyo, all of Japan

[73] Assignee: Tokyo Shibaura Electric Co., Ltd., Kawasaki, Japan

[21] Appl. No.: 738,059

[22] Filed: Nov. 2, 1976

[30] Foreign Application Priority Data

Nov. 5, 1975 [JP] Japan .................... 50-132645

[51] Int. Cl.² ............... H01L 21/20; H01L 21/225
[52] U.S. Cl. ................................ 148/174; 29/578; 29/590; 148/188; 357/59; 427/82; 427/85; 427/86
[58] Field of Search ........... 148/174, 175, 188; 427/82, 85, 86; 29/578, 590; 357/59

[56] References Cited

U.S. PATENT DOCUMENTS

| | | | |
|---|---|---|---|
| 3,375,417 | 3/1968 | Hull et al. | 148/175 X |
| 3,460,007 | 8/1969 | Scott | 148/175 X |
| 3,502,517 | 3/1970 | Sussmann | 148/188 X |
| 3,506,545 | 4/1970 | Garwin et al. | 148/174 X |
| 3,519,901 | 7/1970 | Bean et al. | 148/174 X |
| 3,740,835 | 6/1973 | Duncan | 427/86 X |
| 3,783,050 | 1/1974 | Nanba et al. | 148/188 |
| 3,860,945 | 1/1975 | Dawson | 357/59 X |
| 3,912,557 | 10/1975 | Hochberg | 148/188 X |
| 3,953,866 | 4/1976 | Russell | 357/49 X |
| 4,004,954 | 1/1977 | Tshudy et al. | 148/174 |

OTHER PUBLICATIONS

Chaudhari et al., "Growing Crack-Free Single-Crystal Films" I.B.M. Tech. Discl. Bull., vol. 15, No. 9, Feb. 1973, p. 2700.
Cuomo et al., "Method of Making Unstrained Thin Films".
Ibid vol. 15, No. 9, Feb. 1973, pp. 2698-2699.

Primary Examiner—L. Dewayne Rutledge
Assistant Examiner—W. G. Saba
Attorney, Agent, or Firm—Finnegan, Henderson, Farabow & Garrett

[57] ABSTRACT

A method of producing a semiconductor device, comprising the steps of forming a polycrystalline semiconductor layer on the exposed surface of a single crystalline semiconductor substrate, the substrate containing an impurity of one conductivity type and the polycrystalline layer an impurity of the other conductivity type, and heating the polycrystalline layer for the activation thereof at a temperature substantially preventing the impurity contained therein from being diffused into the substrate. The crystal of the substrate is kept free from lattice defect since the impurity is not diffused thereinto. In addition, this method prevents a short circuit from occurring between semiconductor regions of differing conductivity types which would otherwise be caused by deviation in the location of a mask used in the photoetching step.

2 Claims, 11 Drawing Figures

METHOD OF PRODUCING A P-N JUNCTION UTILIZING POLYCRYSTALLINE SILICON

BACKGROUND OF THE INVENTION

This invention relates to a method of producing a semiconductor device and to a semiconductor device produced by the invented method.

Appended FIG. 1 shows a prior method of producing a semiconductor device, for example, a diode. As shown in FIG. 1A, a $SiO_2$ film (2) is selectively formed on the surface of an N-conductivity type silicon substrate (1). The $SiO_2$ film (2) is formed by, for example, thermally oxidizing the silicon substrate (1), followed by selectivily removing the $SiO_2$ film by a photo-etching technique so as to provide an opening (3). Then, a P-conductivity type doped oxide film (4), such as a silicon dioxide film containing an acceptor impurity, is formed over the entire exposed surface of the substrate (1) and the $SiO_2$ film (2) as shown in FIG. 1B. When the laminated body thus obtained is heat-treated, the acceptor impurity contained in the doped oxide film (4) is diffused into the substrate (1) so as to form a P-conductivity type region (5) within the substrate as shown in FIG. 1C. As the result, a p-n junction is formed within the substrate. Finally, part of the doped oxide film (4) disposed on the P-conductivity type region (5) is removed by a photo-etching technique so as to allow part of the region (5) to be exposed to the atmosphere and, then, a metal film (6) acting as an electrode is formed as shown in FIG. 1D. It is seen that the metal film (6) is in direct contact with the P-conductivity type region (5) and extends over the $SiO_2$ film (2) and the doped oxide film (4). Incidentally, the reference numeral (7) shown in FIG. 1D denotes a metal film (electrode) connected to the N-conductivity type region of the substrate (1). The metal film (7) is formed in substantially the same manner as for forming the metal film (6).

In the prior method described, part of the doped oxide film (4) is removed prior to the formation of the metal film (6) by a photo-etching technique to allow part of the P-conductivity type region (5) to be exposed to the atmosphere. In this step of removing the film (4), a mask of an extremely small pattern for photo-etching is used. This presents a difficulty; when the mask is brought in contact with the photoresist film formed on the doped oxide film (4), a slight deviation inevitably occurs in the location of the mask. The deviation problem is serious particularly where a semiconductor device, for example, a diode is incorporated into an integrated circuit device requiring a pattern of high accuracy.

Appended FIGS. 2A and 2B are intended to explain the inconveniences caused by the deviation problem in question. To be more specific, FIG. 2A shows a case where the doped oxide film (4) disposed on the P-conductivity region (5) has been removed as desired by using a mask for photo-etching, thereby providing an opening (21) satisfactorily. In contrast, FIG. 2B shows a case where the doped oxide film (4) and the $SiO_2$ film (2) have been undesirably etched away because of the deviation in location of the mask. In this case, it is seen that a p-n junction (22) is exposed to the atmosphere. Incidentally, the members equal to those shown in FIG. 1 are denoted by the same reference numerals in FIGS. 2A and 2B. If the p-n junction (22) is exposed to the atmosphere as shown in FIG. 2B, a serious problem is presented. As described previously, a metal film acting as an electrode is formed in the succeeding step in contact with the etched region of the substrate. It follows that the P and N regions of the substrate are short-circuited.

The prior method described utilizes a heat treatment at a high temperature so as to diffuse an impurity into a substrate of one conductivity type, thereby forming a region of the other conductivity type within the substrate. This presents an additional difficulty. Namely, the heating at a high temperature causes a number of lattice defects within the crystal of the substrate. In addition, it is difficult to control accurately the shape of the diffusion region, particularly, the width and depth of the region formed by the diffusion technique.

SUMMARY OF THE INVENTION

An object of this invention is to provide a method of producing a semiconductor device constructed such that a short circuit does not take place between regions of differing conductivity types even if a deviation in the location of a mask has occurred in the masking step.

Another object is to provide a method of producing a semiconductor device capable of minimizing the occurrence of lattice defects within the semiconductor substrate.

The above objects can be achieved by forming a polycrystalline semiconductor region in contact with a single crystalline semiconductor region, the single crystalline region containing an impurity of one conductivity type and the polycrystalline region an impurity of the other conductivity type, followed by heating at a temperature substantially preventing the impurity contained in the polycrystalline region from being diffused into the single crystalline region, so as to activate the polycrystalline region. In the heating step, the impurity of the polycrystalline region should be "substantially" prevented from being diffused into the single crystalline region, namely, the impurity should scarcely enter the single crystal region, or the amount of the impurity diffused into the single crystalline region should be negligible.

DETAILED DESCRIPTION OF THE PREFERRED EMBODIMENTS

FIGS. 3A to 3D show a method of producing a diode according to one embodiment of this invention.

Figure 1A:
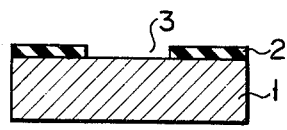
FIGS. 1A to 1D are cross sectional views showing the steps of producing a semiconductor device according to a prior art method.
Figure 1B:
Figure 1C:
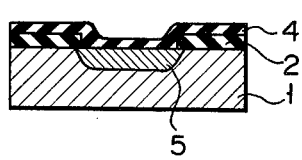
Figure 1D:
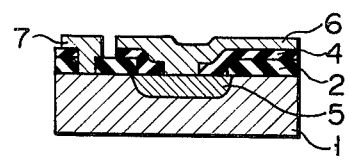
Figure 2A:
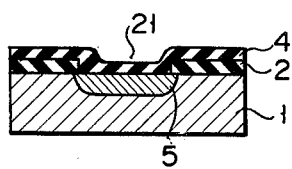
FIGS. 2A and 2B are cross sectional views for explaining the phenomenon resulting from deviation in the location of a mask in the masking step.
Figure 2B:
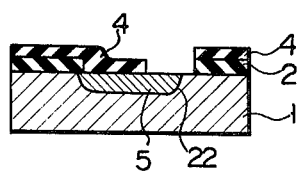
Figure 3A:
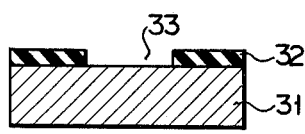
FIGS. 3A to 3D are cross sectional views showing the steps of producing a semiconductor device according to one embodiment of this invention.

Referring to FIG. 3A, a $SiO_2$ layer (32) is selectively formed on the surface of an N-conductivity type silicon substrate (31) of a single crystal. The $SiO_2$ layer (32) is formed by selectively etching the $SiO_2$ layer formed on the entire surface of the substrate (31) by thermal oxidation of the substrate, so as to provide an opening (33). The selective etching is performed by a photo-etching technique.

Figure 3B:

After the SiO₂ layer (32) has been selectively formed on the substrate (31), a consecutive polycrystalline silicon layer (34) containing a P-type impurity is formed by a vapor growth method to cover both the exposed portion of the N-type substrate (31) and the SiO₂ layer (32) as shown in FIG. 3B. Then, the polycrystalline silicon layer (34) is heated for about 20 to 30 minutes at a temperature substantially preventing the impurity contained in the polycrystalline layer (34) from being diffused into the substrate (31), i.e., at about 500° C. to about 1000° C., preferably at about 800° C., so as to activate the polycrystalline layer (34). The heating should be effected under nitrogen atmosphere or an oxidative atmosphere.

Then, the undesired portion of the polycrystalline silicon layer (34) is removed by photo-etching followed by forming a SiO₂ layer (35) by a vapor growth method to cover both the polycrystalline silicon layer (34) and the SiO₂ layer (32).

Figure 3C:
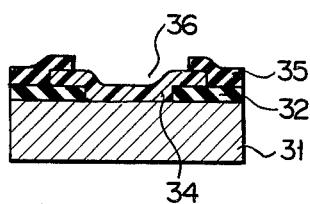

The SiO₂ layer (35) is selectively etched by photo-etching, thereby providing an opening (36) as shown in FIG. 3C. It is seen that the laminated body thus prepared has part of the polycrystalline silicon layer (34) exposed to the atmosphere through the opening (36). Incidentally, the activation of the polycrystalline silicon layer (34) may be effected after the selective etching of this layer (34).

Figure 3D:
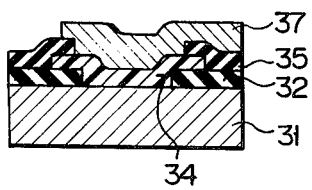

Finally, as shown in FIG. 3D, a metal, such as aluminum, is deposited on the surfaces of the polycrystalline silicon layer (34) and the SiO₂ layer (35), followed by selectively removing the undesired portion of the metal by photo-etching so as to form a metal layer (37) of a desired wiring pattern, the metal layer acting as the electrode.

Figure 4:
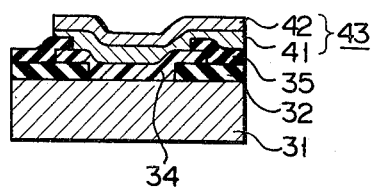
FIG. 4 is a cross sectional view showing a method of producing a semiconductor device according to another embodiment of this invention.

FIG. 4 shows a modification of the metal layer shown in FIG. 3D. Since the diffusion coefficient of aluminum is considerably large, an undercoat metal layer (41) consisting of a metal having a smaller diffusion coefficient, such as chromium or titanium, is formed in direct contact with the polycrystalline silicone layer (34). An aluminum layer (42) is formed on the undercoat metal layer (41), resulting in an electrode metal film (43) of a two-layer structure. Incidentally, the members equal to those of FIG. 3 are denoted by the same reference numerals in FIG. 4.

As described in detail, this invention permits forming a p-n junction along the surface of a semiconductor substrate, unlike the conventional method in which a p-n junction is formed by diffusing an impurity into a semiconductor substrate. Obviously, a short circuit between semiconductor regions of differing conductivity types can be perfectly prevented even if deviation has taken place in the location of a mask for photo-etching, leading to a marked improvement in reliability of the semiconductor device with respect to the electric property. In addition, this invention does not utilize a heat treatment at such a high temperature as intended for an impurity diffusion, resulting in a decreased introduction of lattice defects into the semiconductor crystal. Still further, the difficulty of controlling the shape of a semiconductor region involved in the conventional impurity diffusion method does not exist, thus rendering the production method easier.

The merits of this invention summarized above combine to increase the yield of the semiconductor device to a prominently large extent. For the case of producing, for example, diodes, the yield for this invention was about 40% higher than for the conventional method utilizing an impurity diffusion for the p-n junction formation.

What we claim is:

1. A method of producing a diode, comprising the steps of
forming by vapor growth a polycrystalline silicon layer on the exposed surface of a single crystalline silicon substrate, the substrate containing an impurity of one conductivity type and the polycrystalline silicon layer containing an impurity of the other conductivity type for forming a PN junction,
heating for about 20 to 30 minutes the polycrystalline layer for the activation thereof at a temperature ranging from about 500° C. to 1000° C. with negligible diffusion of the impurity of the polycrystalline silicon layer into the substrate, and
forming a metal layer acting as an electrode on the polycrystalline layer.

2. The method according to claim 1, wherein the heating is effected at a temperature of about 800° C.

* * * * *